(12) United States Patent
Jarosz

(10) Patent No.: US 11,272,649 B2
(45) Date of Patent: Mar. 8, 2022

(54) ELECTRONIC COMPONENT MOUNTING SYSTEM WITH CROSS LINE COMMUNICATION

(71) Applicant: PANASONIC CORPORATION OF NORTH AMERICA, Newark, NJ (US)

(72) Inventor: Lukasz Stefan Jarosz, Evanston, IL (US)

(73) Assignee: PANASONIC CORPORATION OF NORTH AMERICA, Newark, NJ (US)

( * ) Notice: Subject to any disclaimer, the term of this patent is extended or adjusted under 35 U.S.C. 154(b) by 690 days.

(21) Appl. No.: 16/158,895

(22) Filed: Oct. 12, 2018

(65) Prior Publication Data

US 2020/0120840 A1    Apr. 16, 2020

(51) Int. Cl.

| | |
|---|---|
| H05K 13/04 | (2006.01) |
| H05K 13/08 | (2006.01) |
| G05B 19/418 | (2006.01) |
| G05B 19/042 | (2006.01) |
| H05K 13/02 | (2006.01) |

(52) U.S. Cl.
CPC ..... *H05K 13/0419* (2018.08); *G05B 19/0425* (2013.01); *G05B 19/4183* (2013.01); *G05B 19/4184* (2013.01); *H05K 13/0215* (2018.08); *H05K 13/0417* (2013.01); *H05K 13/0452* (2013.01); *H05K 13/084* (2018.08); *H05K 13/086* (2018.08); *H05K 2203/163* (2013.01)

(58) Field of Classification Search
CPC ........... H05K 13/0417; H05K 13/0419; H05K 13/084; H05K 13/086; H05K 13/0452; H05K 13/0215; H05K 2203/163; G05B 19/0425; G05B 19/4183; G05B 19/4184
See application file for complete search history.

(56) References Cited

U.S. PATENT DOCUMENTS

| | | | |
|---|---|---|---|
| 5,908,282 A | 6/1999 | Onodera | |
| 6,480,751 B1 * | 11/2002 | Kuribayashi | ........ H05K 13/086 700/56 |
| 6,842,974 B1 | 1/2005 | Maenishi et al. | |
| 6,971,161 B1 | 12/2005 | Maenishi et al. | |
| 9,439,335 B2 | 9/2016 | Maeda et al. | |
| 2009/0007424 A1 | 1/2009 | Otake et al. | |

(Continued)

FOREIGN PATENT DOCUMENTS

| | | | |
|---|---|---|---|
| JP | 2009044197 A | * | 2/2009 |
| JP | 2013-235906 A | | 11/2013 |
| JP | 2014-086517 A | | 5/2014 |

*Primary Examiner* — A. Dexter Tugbang
(74) *Attorney, Agent, or Firm* — Pearne & Gordon LLP

(57) ABSTRACT

A component mounting system has a supply reel accommodating a component, a plurality of mounting lines each having a mounting apparatus and a line management apparatus, and a central network that provides direct communication between the line management apparatuses of each mounting line. A remaining number of components on the supply reel is determined based on cross line communication between the line management apparatuses and comparison of data at different times stored on the line management apparatuses. Such architecture does not require the use of a central server. Rather, the system is a material information exchange system without a single point of failure, where no one computer failure can cause an entire factory shutdown.

8 Claims, 9 Drawing Sheets

(56) References Cited

U.S. PATENT DOCUMENTS

| | | |
|---|---|---|
| 2010/0050429 A1 | 3/2010 | Maenishi |
| 2013/0074326 A1 | 3/2013 | Uekawa et al. |
| 2016/0128205 A1* | 5/2016 | Maenishi .............. H05K 13/086 29/739 |
| 2016/0174426 A1* | 6/2016 | Kurata ................. H05K 13/084 29/739 |

* cited by examiner

| REEL USE HISTORY DATA | | | |
|---|---|---|---|
| REEL ID | COMPONENT ID | REMAINING NUMBER | LOCATION / TIME |
| | | | |
| | | | |
| | | | |
| | | | |
| | | | |

Figure 6

ELECTRONIC COMPONENT MOUNTING SYSTEM WITH CROSS LINE COMMUNICATION

BACKGROUND OF THE INVENTION

1. Field of the Invention

One or more embodiments of the present invention relate to a component mounting system which mounts, for example, an electronic component onto a substrate.

2. Description of the Related Art

As shown in FIG. 1, in the component mounting field, a component mounting system 1 includes a plurality of mounting lines L1-L3 that each link a plurality of mounting-related apparatuses M11-M34 for executing operations for mounting a component, for example and electronic component, onto a substrate. With a plurality of mounting lines L1-L3 disposed in a production factory, the factory may perform mass production of mounted substrates by performing mounting work together in each mounting line. Operations of each mounting line are integrally managed by an integrated management apparatus (integrated system) 2 in communication with each mounting line via a communication network 3, such as a LAN.

Through the integrated management apparatus 2, each mounting line L1-L3 reads out production data that is necessary for producing the substrate, and sends mounting operation information from the mounting line, such as the number of produced substrates or the number of used electronic components, to the integrated management apparatus 2. The integrated management apparatus 2 stores the production data and component library data including identification information of the electronic component used in each mounting line L1-L3, and collects and manages the operation information sent from each mounting line L1-L3.

Mounting apparatuses M11-M34 of the mounting lines L1-L3 are configured to mount components supplied by a tape feeder onto the substrate. The tape feeder sends a carrier tape, having a plurality of components thereon, through a mounting apparatus, which picks up each component with a mounting head and places the component on the substrate. The carrier tape is wound around a supply reel having a barcode label with identification information of the electronic component. When the supply reel is mounted on the tape feeder, the identification information is read out from the barcode label by using a barcode reader provided in the mounting line. Based on the identification information, the integrated management apparatus 2 can determine whether or not the component accommodated in the supply reel is correct for the mounting line and apparatus.

BRIEF SUMMARY OF THE INVENTION

According to the example of the present disclosure, a component mounting system comprises: a supply reel configured to accommodate a component to be mounted to a substrate, the supply reel being associated with a reel identifier (ID); a plurality of mounting lines, each of the mounting lines comprising: a plurality of mounting apparatuses configured to mount the component supplied by the supply reel on the substrate; and a line management apparatus having a storage device that stores data associating the reel ID and a remaining number of components accommodated by the supply reel at a time point, and a processor configured to monitor the remaining number of components; and a central network configured to provide direct communication between the line management apparatuses of each of the plurality of mounting lines, wherein: when the supply reel is mounted to a mounting apparatuses in a first mounting line, the processor of the line management apparatus of the first mounting line is configured to determine the remaining number of components accommodated by the supply reel based on stored data that is associated with a most recent time point, and the stored data that is associated with a most recent time point is identified via communication between the line management apparatus of the first mounting line and line management apparatuses of other mounting lines via cross line communication over the central network.

In various embodiments of the above example, when the data that is associated with a most recent time point is stored on a line management apparatus of one of the other mounting lines, the data is copied from the line management apparatus of the one of the other mounting lines and replicated on the storage device of the line management apparatus of the first mounting line; when the supply reel still accommodates components and when the data associating the reel ID and the remaining number of components stored on the line management apparatus of the first mounting line indicates the remaining number of components is not greater than zero, the remaining number of components in stored data on the line management apparatus of the first mounting line is updated to be a tolerance in number of components initially provided with the supply reel; when no data associating the reel ID is stored on the line management apparatus of the first line or line management apparatus of the other mounting lines, the line management apparatus of the first system is configured to prompt a user to register the supply reel; the supply reel is configured to accommodate a plurality of components on spliced feeder tapes; the line management apparatuses of the plurality of mounting lines are configured to communicate directly over the central network without a centralized server; the component is a surface mount electronic component; and/or when data associating the reel ID on a line management apparatus of one of the other mounting lines indicates that the supply reel is presently mounted to a mounting apparatus of one of the other mounting lines, the line management apparatus of the first mounting line or the line management apparatus of the one of the other mounting lines is configured to: prompt a user to confirm which mounting apparatus the supply reel is mounted to, and clear a memory of the mounting apparatus of the first mounting line and the mounting apparatus of the one of the other mounting lines.

BRIEF DESCRIPTION OF THE SEVERAL VIEWS OF THE DRAWINGS

FIG. 6 is a view illustrating reel use history data according to one embodiment of the present disclosure.

DETAILED DESCRIPTION OF THE INVENTION

Figure 2:
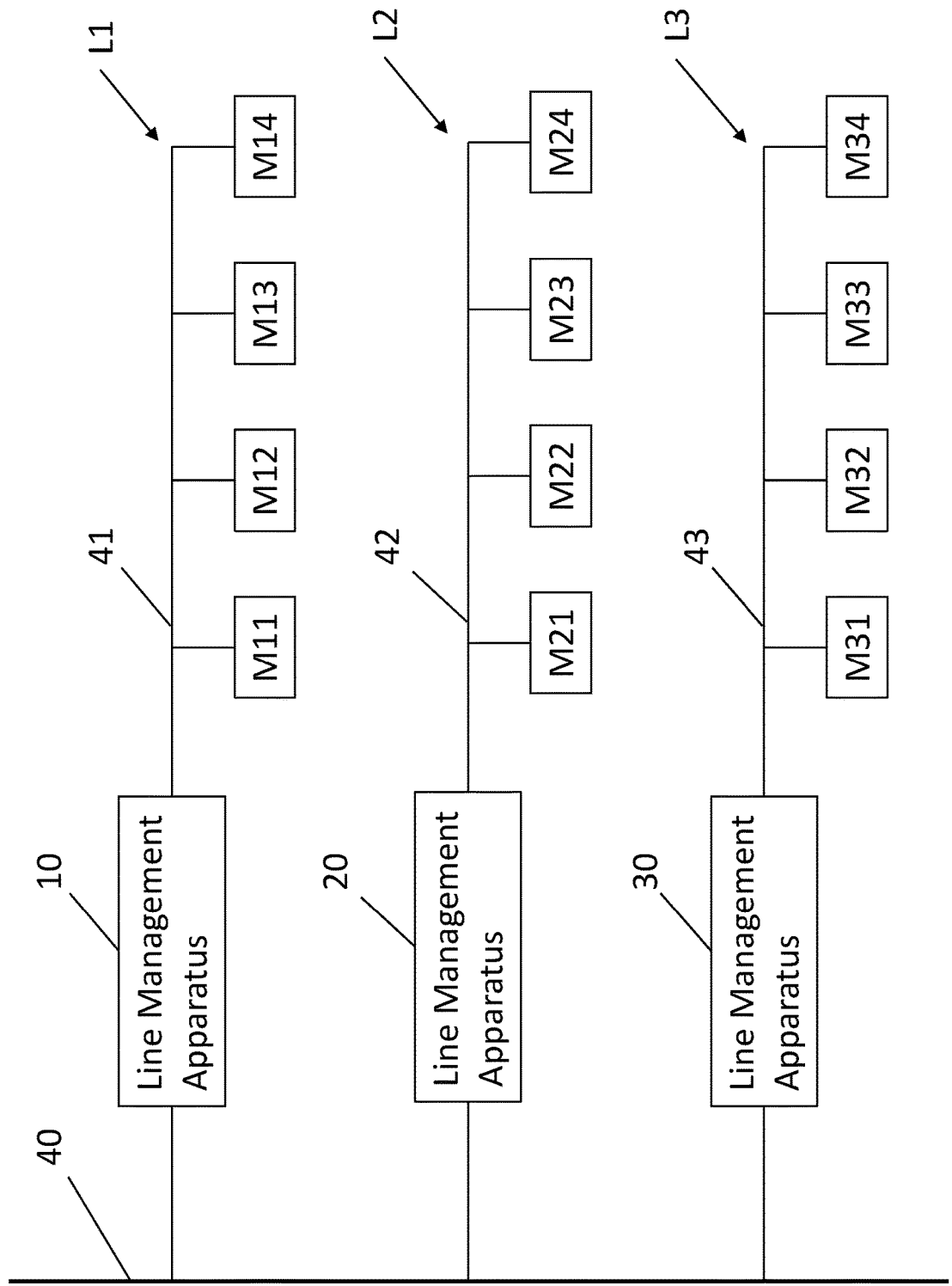
FIG. 2 is a configuration view of a component mounting system according to one embodiment of the present disclosure.

With reference to FIG. 2, a component mounting system according to one embodiment of the present invention will be described. By way of example, the component mounting system herein is described as an electronic component mounting system that mounts, for example, surface mount electronic components. However, the present disclosure is not limited to particular types of components and is thus applicable to any component mounting system. Further, by way of example, the system is described with respect to three mounting lines. However, the present disclosure is not limited by any particular number of mounting lines.

As discussed above with respect to FIG. 1, the component mounting system shown in FIG. 2 includes a plurality of mounting lines L1-L3, each having a plurality of mounting apparatuses M11-M34. The mounting lines L1-L3 each also comprise a line management apparatus 10, 20, 30. The line management apparatuses 10, 20, 30 of mounting lines L1-L3 are in communication with each other over a central network 40. Communication between each mounting line L1-L3 is hereinafter referred to as "cross line communication," whereby each mounting line (and each line management apparatus) is in two-way communication with the other mounting lines (and other line management apparatuses) directly, without the need for a central server. In contrast, the configuration shown in FIG. 1 relies on the integrated management apparatus 2 acting as a centralized server coordinating and managing mounting apparatuses M11-M34 in each mounting line. The central network 40 may be a local area network (LAN), intranet, the Internet, or any other network that provides a one-to-many communication. In other embodiments, each line L1-L3 may be connected to the other lines via individual peer-to-peer communication. The central network 40 communication can be facilitated via wired communication or wireless communication.

Each of the line management apparatuses 10, 20, 30 manage various types of information handled by the respective lines L1-L3 of the component mounting system, and collect and store production data which is used in the production of the mounted substrate by the mounting apparatuses M11-M34 of the respective mounting line L1-L3. As such, each of the line management apparatuses 10, 20, 30 includes a control device. The control device may include, e.g., at least one memory, hard drive, or like storage device configured to store instructions and a database or similar collection of production data, and at least one processor configured to execute the instructions to cause the apparatus to perform at least one of the operations thereof. In other words, the line management apparatuses 10, 20, 30 may be embodied as computers having processors, storage devices (hard drives, memory, and the like), displays, and the like, and may be more particularly embodied as either personal computers (e.g., tablets, laptops, desktop computers).

Each mounting line L1-L3 is configured by linking a plurality of mounting-related apparatuses M11-M34 used in mounting components onto a substrate to each other in a carrying direction of the substrate. Each element of the mounting lines L1-L3, including the respective line management apparatuses 10, 20, 30 and mounting apparatuses M11-M34, may be in communication via a line network 41, 42, 43, such as a local area network (LAN), intranet, or the Internet and can be facilitated via wired communication or wireless communication. The line networks 41, 42, 43 may be completely isolated from the central network 40, and thus from each other, so that failure in one line network does not cause a failure to the entire system. However, in other embodiments it is still possible for the line networks 41, 42, 43 to be integrated with the central network 40.

Using mounting line L1 as an example, mounting apparatus M11 may be a printing apparatus or other mounting support apparatus, and mounting apparatuses M12-M14 may be component mounting apparatuses. With a printing apparatus M11, a soldering paste may be printed on an electrode of the substrate. The component mounting apparatuses M12-M14 may then mount different components onto the substrate on which the soldering paste is printed. These mounting apparatuses M11-M34 may also thus include integrated or externally connected computers having processors, storage devices, displays, and the like.

Figure 3:
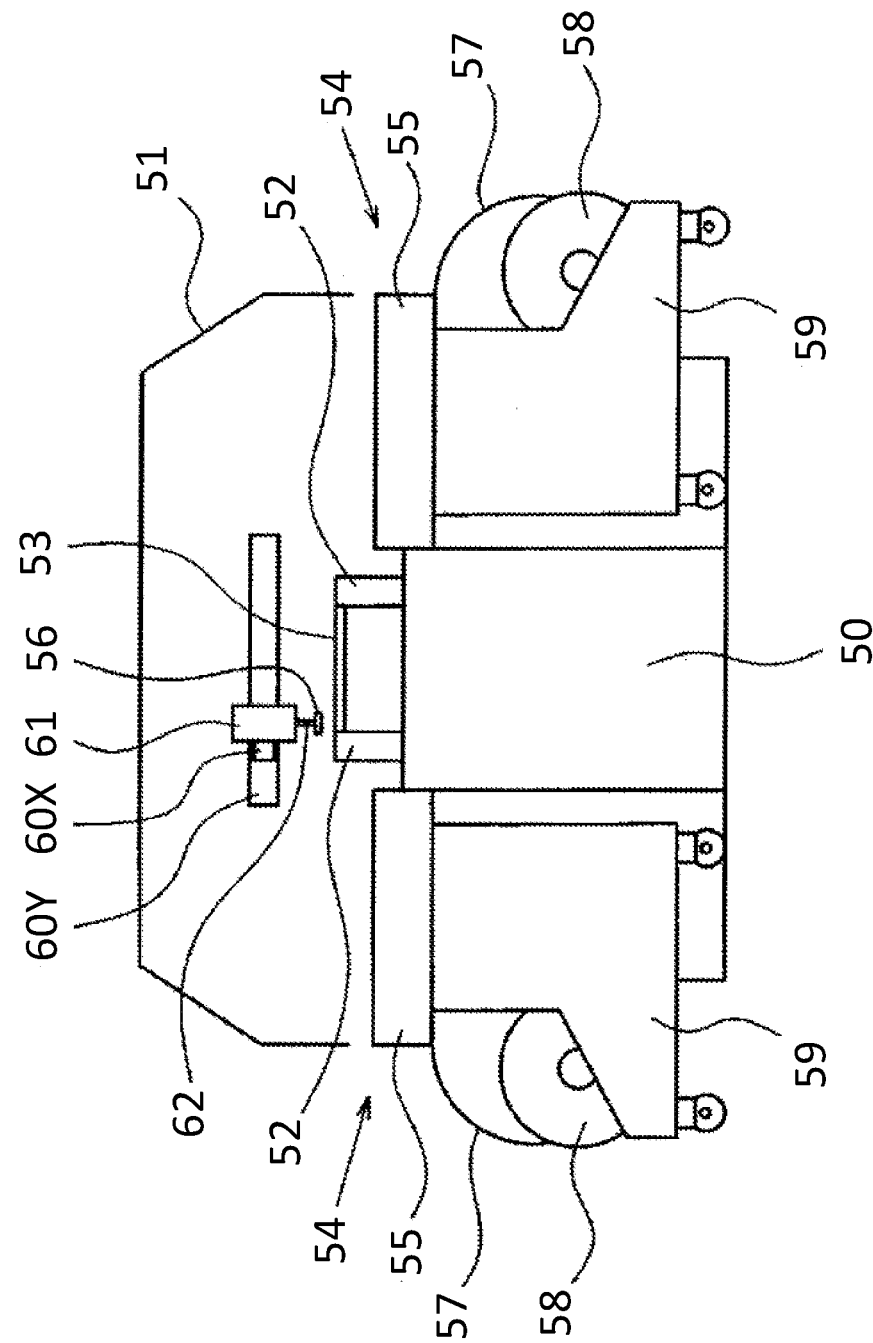
FIG. 3 is a view illustrating a structure of a component mounting apparatus provided in the electronic component mounting system according to one embodiment of the present disclosure.

Next, with reference to FIG. 3, the component mounting apparatuses M12-M14 will be described. Hereinafter, the carrying direction of the substrate is defined as an X direction, and a direction which is orthogonal to the X direction within a horizontal surface is defined as a Y direction. The component mounting apparatuses M12-M14 include a base 50 and cover 51. A substrate carrier 52, having one pair of carrying conveyors that extend in the X direction, is provided on an upper surface of the base 50. The substrate carrier 52 carries and positions a substrate 53 to a predetermined mounting work position. Component supply units 54 are respectively provided at positions on both sides of the substrate carrier 52 in the Y direction. A plurality of tape feeders 55 are disposed in a state of being aligned in the X direction within the component supply units 54.

The tape feeder 55 sends a carrier tape 57, which holds a plurality of components 70 at a spaced interval, and supplies the components 70 to a component picking-up position. The carrier tape 57 is wound around a supply reel 58, and the supply reel 58 is held to be freely rotatable by a reel holder provided in a cart 59.

Figure 4:
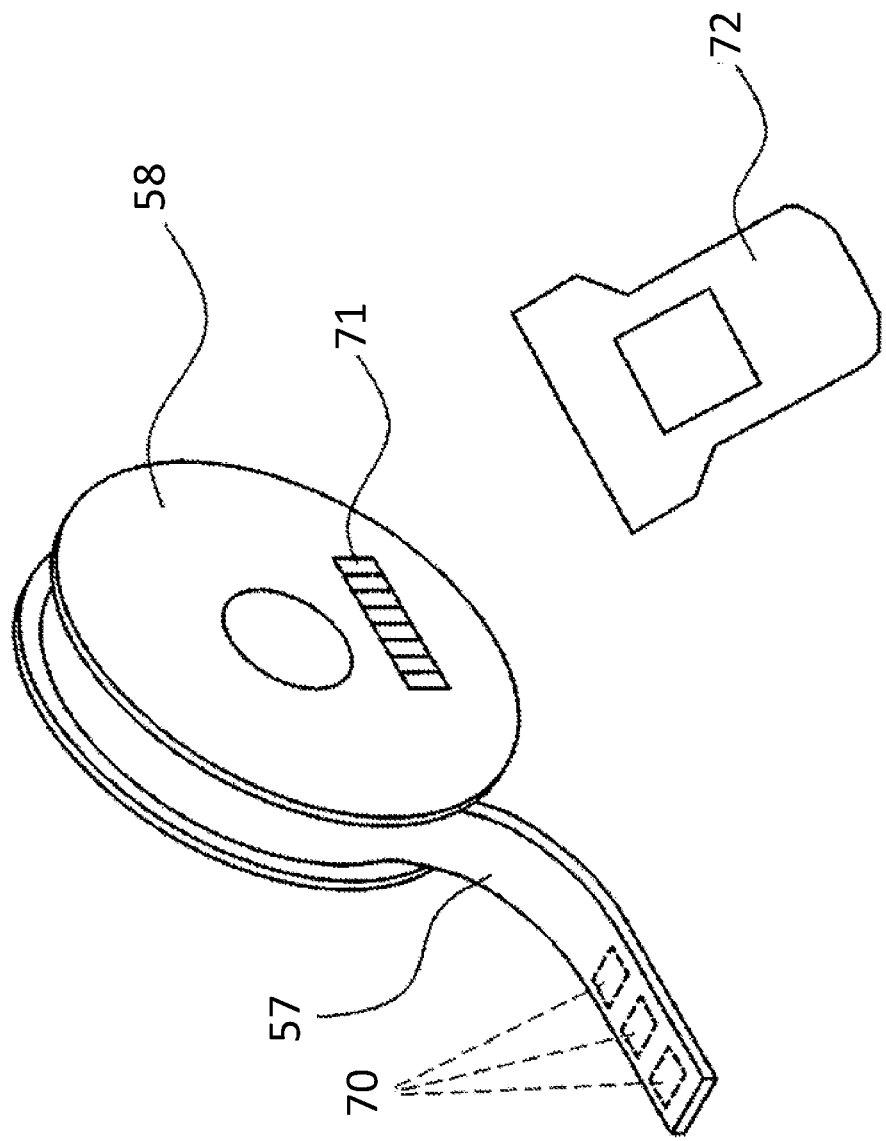
FIG. 4 is a view illustrating a structure of a barcode reader which is provided in the component mounting system and a supply reel which is set in the component mounting apparatus according to one embodiment of the present disclosure.

As shown in FIG. 4, a barcode label 71, or other recording medium, is attached to a side surface of the supply reel 58. The barcode label 71 encodes a reel ID (identification information) for identifying the component 70 held by the carrier tape 57 that is wound around the supply reel 58. The reel ID is associated with, or the barcode label 71 further encodes, the total number (initial value) of the components 70 of a new supply reel 58. As further shown in FIG. 4, the component mounting apparatuses M12-M14 are provided with a barcode reader 72, which may be in communication with the mounting line management apparatus 10 in a wireless or wired manner. The barcode or like reader 72 is configured to read the reel ID by making a reading-out surface thereof face the barcode label 71.

Particularly, when a supply reel 58 is mounted to (or de-mounted from) one of the mounting apparatuses M12-M14, a user scans the barcode label 71 with barcode reader 72. The read-out reel ID is sent to the mounting line management apparatus 10 and used when managing the component 70 accommodated in the supply reel 58 to determine whether or not the proper supply reel 58 (having the proper components 70) is mounted to the mounting apparatus M12-M14. The line management apparatus 10 further uses the reel ID to identify a remaining number of components 70 on the carrier tape 57 of the supply reel 58 to help control operation of the mounting line L1 and mounting apparatuses M11-M14. It is noted that an installation location of the barcode reader 72 is arbitrary, and the barcode reader 72 and the mounting line management apparatus 10 may be directly connected to each other, instead of via the component mounting apparatuses M12-M14.

Referring back to FIG. 3, a Y-axis beam 60Y which extends in the Y direction is provided in an end portion of the base 50 in the X direction, and an X-axis beam 60X which extends in the X direction is provided to freely move in the Y-axis beam 60Y. In addition, a mounting head 61 is mounted on the X-axis beam 60X to freely move in the X direction. The Y-axis beam 60Y and the X-axis beam 60X move the mounting head 61 in the X direction and in the Y direction, respectively. The mounting head 61 is provided with a plurality of suction nozzles 62, each of which is configured to suction the components 70 accommodated on the carrier tape 57 of the supply reel 58. Each of the suction nozzles 62 suctions and picks up the component 70 supplied to the component picking-up position by the tape feeder 55, and mounts the component 70 onto the substrate 53. In this manner, the component mounting apparatuses M12-M14, which are but one possible kind of mounting apparatus included in a mounting line L1, pick up the component 70 and mount the component 70 onto the substrate 53.

Figure 5:
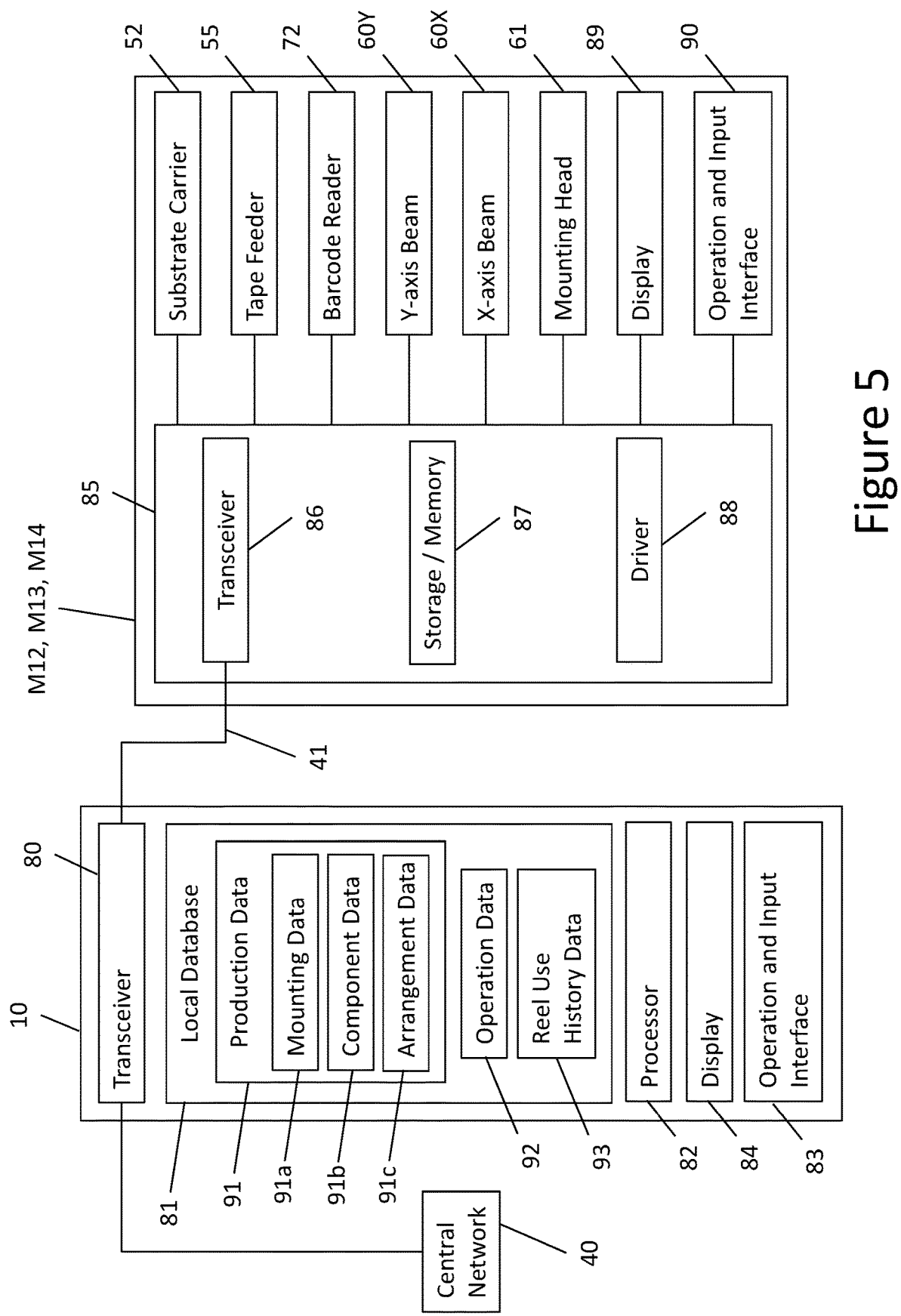
FIG. 5 is a block diagram illustrating a control system of the electronic component mounting system according to one embodiment of the present disclosure.

Next, with reference to FIG. 5, a configuration of a control system of the component mounting system will be described with line L1 again used as an example. The line management apparatus 10 (or line management apparatuses 20 and 30 in lines L2 and L3) includes a transceiver 80, a local database 81, a processor 82, an operation & input interface 83, and a display 84 (e.g., local to the line management apparatuses 10, 20, 30 or displaying a web interface hosted remotely). A control system 85 of the mounting apparatuses M12-M14 (or mounting apparatuses M22-24 and M32-34 in lines L2 and L3) includes a transceiver 86, a storage unit such as a memory or a hard drive 87, and a driver such as a controller or processor 88. The storage unit 87 can include information about the supply reel 58 currently mounted to that apparatus including, for example, a reel ID, a component ID, programming time, operator information, and an apparatus ID. In addition, the control system 85 is connected to actuation elements such as the substrate carrier 52, the tape feeder 55, the barcode reader 72, the Y-axis beam 60Y, the X-axis beam 60X, the mounting head 61, a display 89, and an operation and input unit 90. Other mounting apparatuses, such as support apparatuses like the printing apparatus M11 (or mounting apparatuses M21 and M31 in lines L2 and L3) may have a control system similar to control system 85 of mounting apparatuses M12-M14, but with different actuation elements for printing or other mounting support functions.

The transceivers 80 and 86 are connected to each other via the line network 41 (or line networks 42 and 43 in lines L2 and L3). In addition, the transceiver 80 of line management apparatus 10 is connected to the transceivers of other line management apparatuses 20, 30 via the central network 40. Therefore, it is possible to perform sending and receiving of various types of data between each of the line management apparatuses 10, 20, 30, and the component mounting apparatuses M11-M34.

The local database 81 in each line management apparatus 10, 20, 30 stores production data 91, operation data 92, reel use history data 93, and the like. The production data 91 is configured of various types of data for producing the mounted substrate, and includes mounting data 91a, component data 91b, and arrangement data 91c. The mounting data 91a may be data for mounting the component 70 onto the substrate 53, and include, for example, an XY coordinate of the mounting position set on the substrate 53, and a mounting angle of the component 70.

The component data 91b may be data indicating a control parameter of an actuating element(s) when mounting the component 70 onto the substrate 53. For example, the component data 91b can include the shape of the component 70, a sending pitch of the carrier tape 57, a type of suction nozzle 62 used, and a speed parameter, such as a suction speed when the suction nozzle 62 suctions the component 70, or a mounting speed when the component 70 is mounted onto the substrate 53.

The arrangement data 91c may be data indicating arrangement information of each tape feeder 55 disposed in the component supply unit 54, and can be configured by combining the "reel ID" and a "feeder address No.". The "feeder address No." indicates the feeder/mounting apparatus positional information of each tape feeder 55.

The operation data 92 may be data indicating operation information of the mounting apparatuses M11-M34 for the line associated with the line management apparatus 10, 20, 30. The operation information includes, for example, the number of produced mounted substrates, generated errors and frequency thereof, the number of components 70 used, and the like.

FIG. 6 illustrates one example of the reel use history data 93, which may be data indicating information regarding all of the components 70 and supply reels 58 used in the corresponding mounting line L1-L3. The reel use history data 93 includes, for example, an association of a "component ID" 93b, a "remaining number" of components 93c, and a "location and time" 93d with a "reel ID" 93a. The "component ID" 93b may be an identification number of the components 70 on the corresponding supply reel 58, and may be associated with a type of component 70 (e.g., a capacitor or a resistor and particular parameters). Further information about the component may be included in the component data 91b. The "remaining number" 93c may indicate the number of remaining electronic components 70 accommodated in the corresponding supply reel 58, and/or the total number of the components 70 accommodated in the corresponding supply reel 58 before supply reel is mounted to a mounting apparatus. The "location and time" 93d may indicate information that specifies to which component mounting apparatus M11-M14 the supply reel 58 is currently, or was last, mounted and the corresponding time. In this manner, the local database 81 of a line management apparatus 10, 20, 30 stores information regarding the components 70 accommodated in the supply reels 58 used in the corresponding mounting line L1-L3 in association with the identification information (component ID). Particularly, the local database 81 stores information regarding the number of remaining electronic components 70 accommodated in each supply reel 58 at a given time.

Figure 7:
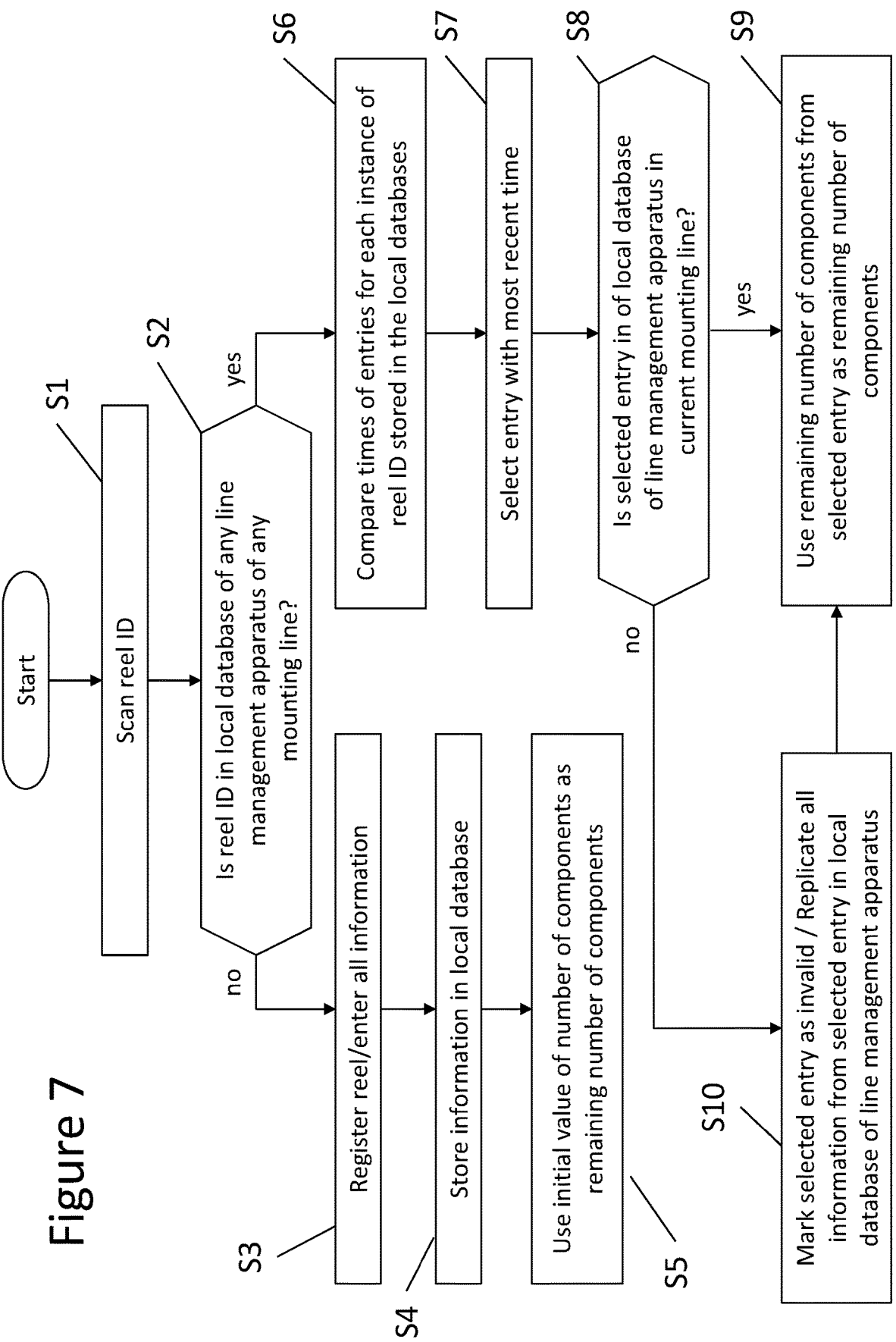
FIG. 7 is a flowchart illustrating operation of a component mounting system according to one embodiment of the present disclosure.

With reference to FIG. 7, operation of the component mounting system, particularly with regard to cross line communication, will now be described. Prior to beginning a production cycle on a mounting line L1-L3, a user mounts supply reels 58, each containing carrier tape 57 and components 70 thereon, to appropriate mounting apparatuses M11-M14. The supply reel 58 may be new, such that the carrier tape 57 is full of components 70, or may be partially used, such that the carrier tape 57 is not full of components 70. In the case that the reel 58 is not full, it may have previously been mounted to a different mounting apparatus M11-M34 of the same mounting line L1-L3, or a mounting apparatus M11-M34 of a different mounting line L1-L3, during a previous production cycle.

When mounting a supply reel 58, a user scans (step S1) the reel ID from barcode label 71 with barcode scanner 72. The scanned reel ID is transmitted to the line management apparatus 10, 20, 30 of the line L1-L3 of the mounting apparatus M11-M34 to which the reel 58 is being mounted. There, the line management apparatus 10, 20, 30 determines (step S2) whether the scanned reel ID is present in its local database 81, and communicates with each of the other line management apparatuses 10, 20, 30 over central network 40, via cross line communication, to determine whether the scanned reel ID is present in the local database 81 of any other line management apparatus 10, 20, 30. If the scanned reel ID is not present in any line management apparatus 10, 20, 30, the supply reel 58 is presumed to be new and the user is prompted to register (step S3) the reel by entering all associated information related to the supply reel 58 and components 70 thereon. The registration information is then stored (step S4) in the local database 81 of the line management apparatus 10, 20, 30 of the line L1-L3 of the mounting apparatus M11-M34 to which the reel 58 is being mounted. Finally, the initial number of components associated with the supply reel 58 (e.g., as provided by the supplier of the reel) is stored and used (step S5) to represent the remaining number of components (e.g., as stored in reel use history data 93) of the supply reel 58 associated with the scanned reel ID. That is, because the supply reel 58 has been identified as new it is expected that none of the components 70 thereon have been mounted to a substrate. Here it is noted that the initial number of components of each supply reel is often provided by the supplier of the supply reel 58 within a given tolerance. For example, a supplier may provide a supply reel 58 having 50,000 components thereon, within a 2% tolerance. Thus, the supply reel 58 may actually have 49,000-51,000 components thereon.

If, at step S2, the reel ID is found in a local database 81, the time stamps (e.g., as stored in reel use history data 93) of each instance of the scanned reel ID are compared (step S6). The scanned reel ID entry having the most recent time is then selected (step S7) as having the most recent and accurate information associated with the reel ID. If the most recent entry is, in the local database 81 of the line management apparatus 10, 20, 30 of the line L1-L3 of the mounting apparatus M11-M34 to which the reel 58 is being mounted, the remaining number of components associated with that entry is used (step S8, S9) as the remaining number of components for the supply reel 58 associated with the scanned reel ID. If the most recent entry is stored in the local database 81 of a line management apparatus 10, 20, 30 of a different line L1-L3, then all information associated with that entry is copied over the central network 40 and replicated (step S8, S10) in the local database 81 of the line management apparatus 10, 20, 30 of the line L1-L3 of the mounting apparatus M11-M34 to which the reel 58 is being mounted. Thus, the remaining number of components associated with the most recent time stamp is understood as the remaining number of components on the supply reel 58.

Further, because the reel is being mounted at a new apparatus, the entry from which the reel information is replicated is marked as "invalid" (step S9). Marking the source entry as invalid helps prevent situations where the system believes two lines L1-L3 or machines M11-M34 are using the same reel, when a reel may only be mounted to one machine at a time. It is also noted that this method is applicable to moving a supply reel 58 between mounting apparatuses within a single mounting line.

With the above arrangement, if a supply reel 58 is moved between mounting lines L1-L3 between different production cycles, the corresponding reel information is accessible to any mounting line management apparatus via the cross line communication over network 40, even if the supply reel 58 had never been used in the corresponding mounting line L1-L3. For example, a supply reel 58 having 50,000 capacitors is first registered upon mounting to mounting apparatus M12 of line L1. In registering the supply reel 58, the local database 81 of line management apparatus 10 stores the reel ID, component ID for the capacitor, the initial number of components (50,000) as the remaining number of capacitors, and the location and time of the reel 58 (mounting apparatus M12 of line L1 at time T1). During a production cycle of line L1, 20,000 capacitors are mounted to substrates. In real time, or following the production cycle (e.g., at time T2), the number of capacitors mounted from supply reel 58 is transmitted from mounting apparatus M12 to line management apparatus 10. With this information, the line management apparatus can determine, and update its local database 81, to note that the reel ID associated with supply reel 58 has 20,000 fewer capacitors (now 30,000) at time T2 on mounting apparatus M12 of line L1. If the capacitors of supply reel 58 are then needed for a production cycle on mounting apparatus M23 of mounting line L2, a user may move the supply reel 58 to mounting apparatus M23 and upon mounting thereon, scan the barcode label 71 of the supply reel 58. The scanned reel ID is then transmitted to line management apparatus 20, which does not have any data concerning the scanned reel ID but identifies, over the cross line communication via network 40, that line management apparatus 10 has two entries for the scanned reel ID (indicating 50,000 components at time T1 and 30,000 components at time T2). The entry associated with the most recent time (T2) is selected, and all associated information is copied and replicated at local database 81 of line management apparatus 20 of line L2. Thus, line management apparatus 20 would understand that there are 30,000 components remaining on supply reel 58.

In another scenario, the above arrangement allows for transfer of accurate information in the event of a mounting line failure. For instance, further to the above example, at a time T3, line L2 has mounted an additional 10,000 components from the supply reel 58 such that the supply reel only has 20,000 remaining components. If mounting line L2 suffers a failure at time T3, the supply reel may be moved to mounting line L3 to continue production. If the failure does not affect line management apparatus 20 of line L2, the line management apparatus 30 of line L3 can obtain the most recent information relating to the capacitors on supply reel 58 and know that only 20,000 capacitors remain on the supply reel, as described above. However, if the failure involves line management apparatus 20 of line L2 such that line management apparatus 30 of line L3 cannot communicate with line management apparatus 20 via cross line communication over the central network 40, the line management apparatus 30 of line L3 may still replicate information related to supply reel 58 from line management apparatus 10 of line L1. Although the remaining number of components will be that at time T2, this number is more accurate than if the supply reel 58 had to be re-registered, where the initial value of 50,000 would be used as the known remaining number of components. Still further, the other associated data need not be re-registered and subject to human error or time.

Figure 1:
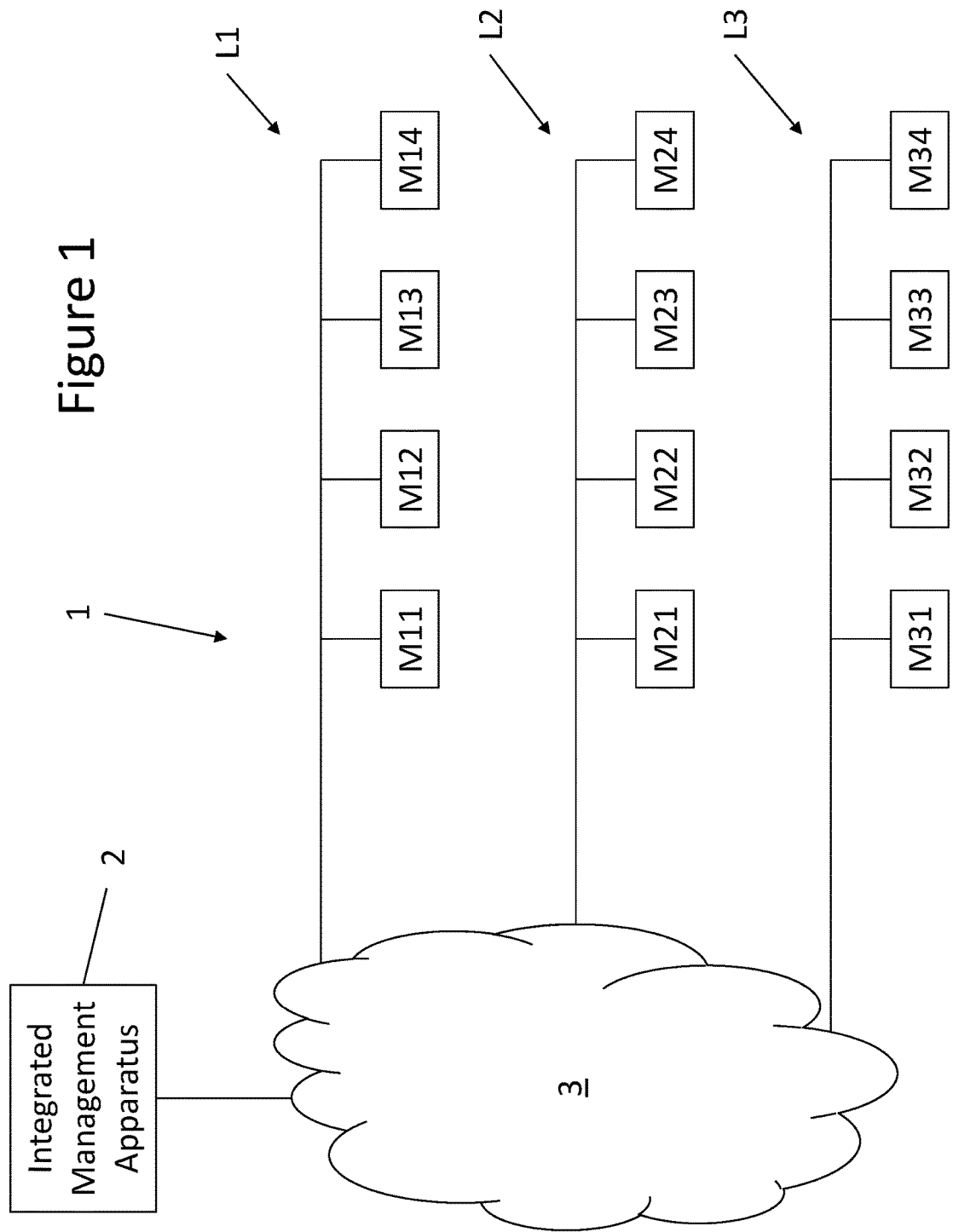
FIG. 1 is a configuration view of an existing component mounting system.

This configuration is contrasted to that of mounting system 1 discussed above with respect to FIG. 1, which requires an integrated management apparatus 2. In the system of FIG. 1, if the integrated management apparatus 2 or network 3 were to fail (e.g., during an upgrade, or power outage), each mounting line would be rendered inoperable. This is because no mounting apparatus would be in communication with a control system. Even if each mounting line had its own management apparatus, because all information would be centrally stored and accessible at the integrated management apparatus, there could be no cross line communication. In other words, integrated management apparatus 2 serves a router for information between mounting lines, such that obtaining information related to other mounting lines requires access to the integrated management apparatus 2. Thus, each mounting line would at best be isolated during a failure and require re-registering of all supply reels. Accordingly, it would not be possible to accurately update information as supply reels are moved between mounting lines.

While a central server such as integrated management apparatus 2 is not required for the system of the present disclosure, one may still be included. Such a central server may monitor the activities in each mounting line L1-L3. In this manner, if mounting line L2 fails as noted above, but communication over central network 40 remains with a central server, the central server may act as a "backup" for an inoperable line management apparatus 20 of line L2. Thus, the central server may provide updated component information (or estimated usage of components of a supply reel from a failed line, for example, based on a known mounting rate and an uptime) to line management apparatus 30 of line L3. Further, the central server may serve as a time server to ensure synchronization of times for each line management apparatus 10, 20, 30. However, precise time synchronization is not necessary because there is some amount of time between the uses of a single supply reel 58 in different production cycles. As long as the local time of each line management apparatus 10, 20, 30 is within this range, the line management apparatuses 10, 20, 30 are capable of determining which data entry for a reel ID is the most recent.

The above configuration is also applicable for scenarios in which the components of a supply reel are modified. For instance, two carrier tapes 57 may be spliced together on a single supply reel 58. The carrier tapes may include the same component, or a different component such as a suitable substitute (e.g., a different capacitor having different, but suitable characteristics). In this case, after splicing the carrier tapes 57, a user may update the information associated with the reel ID of the supply reel 58 to include that of the component on the spliced carrier tape 57. Therefore, when the supply reel 58 is moved between mounting lines L1-L3, the new mounting line can replicate the correct information associated with reel ID—the information related to the component of the spliced carrier tape 58—and thus know that additional and/or different components have been added and that the supply reel contents no longer correspond to those that were initially registered. For example, a supply reel 58 mounted to a mounting apparatus M11-M14 in line L1 may be spliced during a production cycle and then moved to a mounting apparatus M21-M24 in line L2. Upon mounting to the mounting apparatus M21-M24 of line L2, the line management apparatus 20 of line L2 retrieves information about the splicing, with updated component information, from the line management apparatus 10 of line L1.

Figure 8:
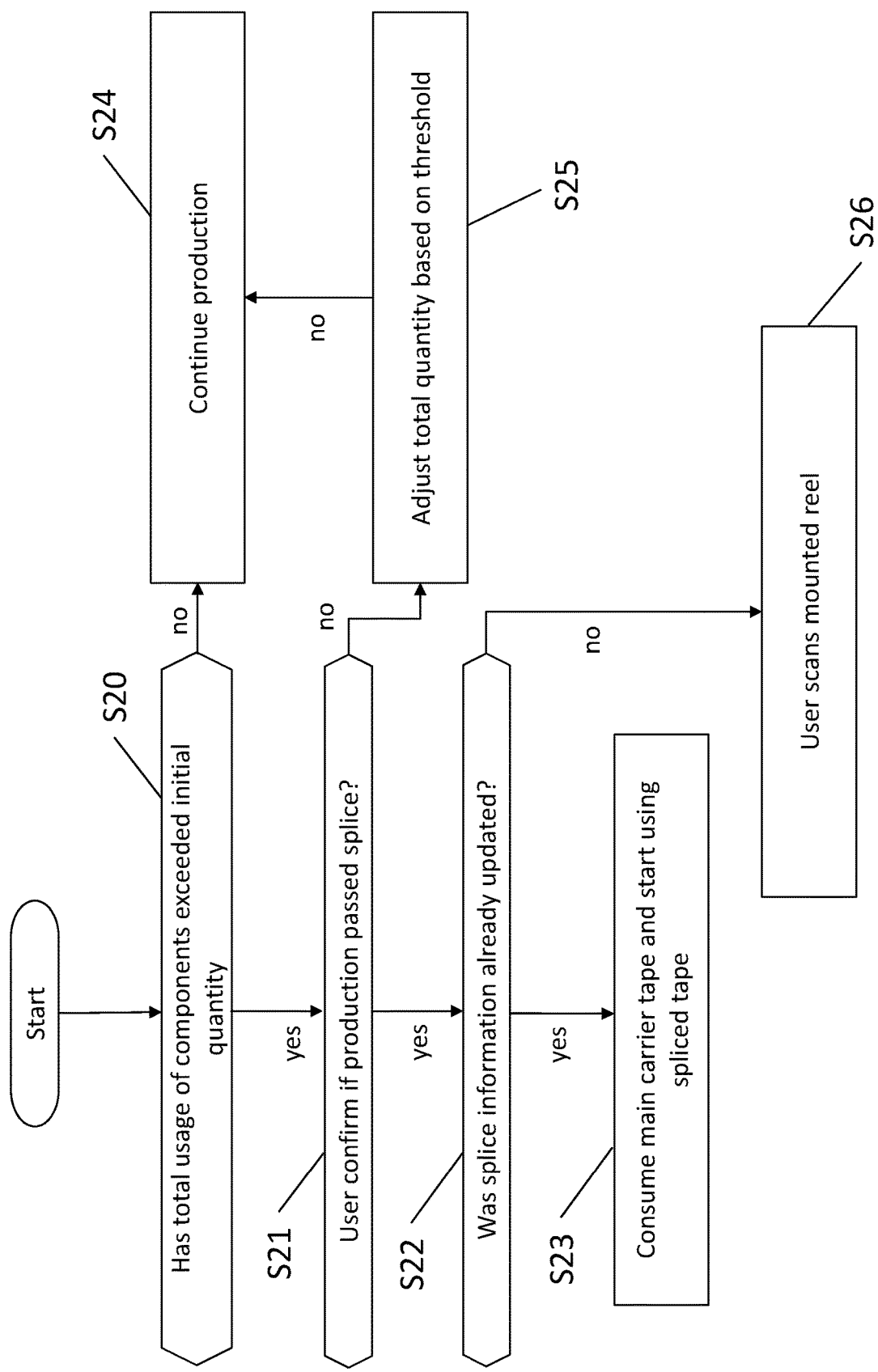
FIG. 8 is a flowchart illustrating operation of a component mounting system according to another embodiment of the present disclosure.

The above process is illustrated in one example shown in FIG. 8. There, during a production cycle the supply reel 58 is continually monitored (step S20) to ensure components 70 remain on the carrier tape 57 by comparing number of used components to the initial quantity associated with the supply reel 58. If there are still components 70 on the carrier tape 57, the number of remaining components on the carrier tape 57 as indicated in the local database 81 of the line management apparatus 10, 20, 30 is updated as each component is placed and production continues (S24). If the local database 81 indicates that there are no remaining components (step S20), a user is prompted to indicate whether the carrier tape 57 has been spliced or the system otherwise detects (step S21) a splice (e.g., by recognizing splice tape) in the carrier tape 57 that may provide additional components. Here, the user can confirm that a splice indicator was missed and the main reel was consumed or can scan (discussed later with respect to step S26) a reel that was previously physically spliced but was not recorded in the system. If there has not been a splice, the total number of components of the supply reel is updated to be the initial number of components plus a threshold (step S25). This threshold may be, for example, the tolerance of components on each supply reel 58. For example, a 50,000 component supply reel with a 2% tolerance may have up to 51,000 components thereon, and thus, the threshold may be 1,000. Thus, the supply reel 58 may actually have up to 51,000 components thereon. Production then continues (step S24) until the components on the supply reel are exhausted, at which point then the line management apparatus 10, 20, 30 transmits an alert S24 to the displays 84 and/or 89 of the line management apparatus 10, 20, 30 and/or mounting apparatuses M11-M34 in each mounting line L1-L3. Where the alert is transmitted to multiple mounting lines L1-L3, the alert is transmitted over central network 40 via the cross line communication. In other embodiments, the alert may be alternatively or additionally be an audible noise. Further, the local database 81 is updated to indicate that there are zero remaining components associated with the empty supply reel 58.

If the user confirms (or the system detects) a splice (step S21), the system determines whether the local database 81 has been updated with information about the spliced carrier tape (step S22). If the information has been updated, production continues using the original carrier tape and the spliced carrier tape (step S23). If the information has not been updated, the user scans the supply reel from which the spliced carrier tape was supplied to update the local database (e.g., to associate the information of the supply reel with the new carrier tape with that of the already mounted supply reel).

Figure 9:
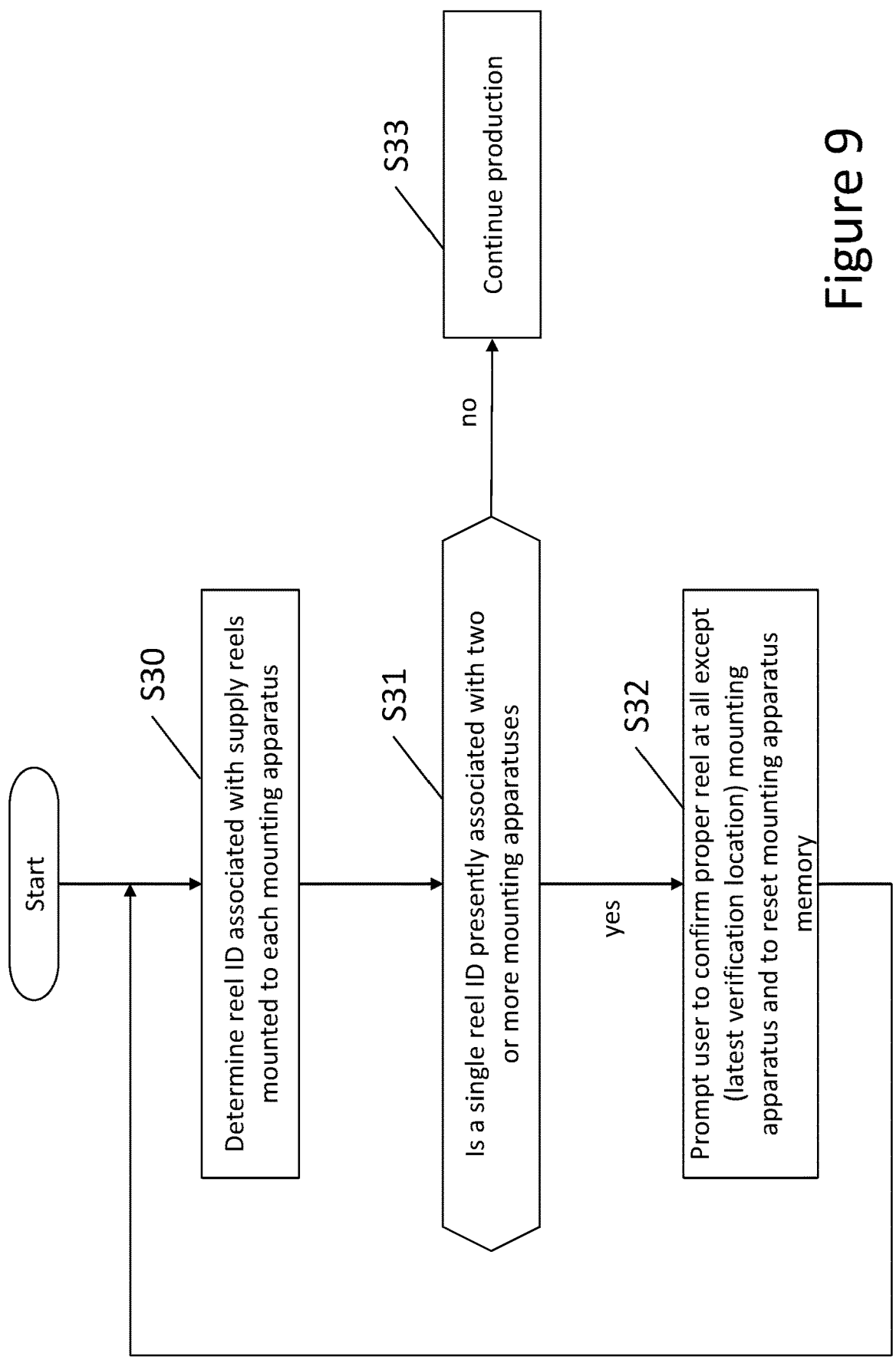
FIG. 9 is a flowchart illustrating operation of a component mounting system according to another embodiment of the present disclosure.

Still another embodiment of the operation of the component mounting system described herein is illustrated with respect to FIG. 9. There, upon startup, the reel IDs associated with supply reels 58 are determined (step S30). This may include the reel ID for a particular apparatus when starting up only a single mounting apparatus M11-M34 or mounting a supply reel 58 to an apparatus M11-M34, or the reel IDs for any or all of supply reels 58 mounted to mounting apparatuses M11-M34 when starting up one or more mounting apparatuses M11-M34 and/or mounting lines L1-L3. Next the reel ID is cross-checked (step S31) with the reel IDs mounted to the other mounting apparatuses M11-M34 in the system. If the reel ID is not presently (e.g., as determined by comparing the stored locations and times in local database entries) associated with any other mounting apparatus M11-M34, then mounting and/or startup, and production, may proceed (step S33). However, if the reel ID is presently associated with another mounting apparatus M11-M34, an error is generated and a user is asked to confirm (step S32) the proper reel IDs associated with all of the conflicting mounting apparatuses M11-M34, except the mounting apparatus to which the supply reel was validly mounted (e.g., the mounting apparatuses with an entry not marked as "invalid"). The user may also be instructed to reset the mounting apparatus memory (step S32). Such an error may occur if a user accidentally scans the wrong barcode label 71 when mounting a supply reel 58.

In view of the above, the component mounting system architecture and operation described herein do not require the use of a central server such as an integrated management apparatus. Rather, communication between mounting lines is provided via cross line communication. Accordingly the present disclosure provides a material information exchange system without a single point of failure, where no one computer failure can cause an entire factory shutdown.

Further, the architecture described herein provides linear scalability for a factory. That is, as a factory grows and additional mounting lines are added, only a single mounting line management apparatus need be purchased in addition to the mounting apparatuses for the new line. This mounting line management apparatus can be easily installed by connection to the central network to participate in the cross line communication. In contrast, centralized servers have maximum operational capacity. For example, if a server is only able to support a maximum of ten mounting lines, the addition of an eleventh mounting line requires the purchase and installation of a new central server. Often the required new server is of much greater operational capacity (e.g., fifty mounting lines, an additional operational ability of forty mounting lines) and a significant cost for the minimal addition in production scale of only a single mounting line. Additionally, installation requires shutting down the entire production facility. Viewed another way, an initial cost for a server large enough to support expansion may be required before its use is fully realized. However with the architecture of the present disclosure, the cost of additional management apparatuses may be distributed evenly as each new mounting line is added. Further, each line may be added without requiring production in an entire facility to be halted.

What is claimed is:

1. A component mounting system, comprising:
a supply reel configured to accommodate a component to be mounted to a substrate, the supply reel being associated with a reel identifier;
a plurality of mounting lines, each of the mounting lines comprising:
 a plurality of mounting apparatuses configured to mount the component supplied by the supply reel on the substrate; and
 a line management apparatus having a storage device that stores data associating with the reel identifier and a remaining number of components accommodated by the supply reel at a time point, and a processor configured to monitor the remaining number of components; and
a central network configured to provide direct communication between the line management apparatuses of each of the plurality of mounting lines, wherein:
when the supply reel is mounted to each of the plurality of mounting apparatuses in a first mounting line of the plurality of mounting lines, the processor of the line management apparatus of the first mounting line is configured to determine the remaining number of components accommodated by the supply reel based on stored data, and
the stored data is identified via communication between the line management apparatus of the first mounting line and the line management apparatus of one of the other mounting lines via cross line communication over the central network, and
wherein when the stored data that is associated with a most recent time point is stored on the line management apparatus of one of the other mounting lines, the stored data associating with the reel identifier and the remaining number of components accommodated by the supply reel at the most recent time point is copied from the line management apparatus of the one of the other mounting lines and replicated on the storage device of the line management apparatus of the first mounting line.

2. The component mounting system of claim 1, wherein when the stored data is copied and replicated, an entry from which the stored data is replicated is marked as invalid.

3. The component mounting system of claim 1, wherein when the supply reel still accommodates components and when the stored data associating with the reel identifier and the remaining number of components stored on the line management apparatus of the first mounting line indicates the remaining number of components is not greater than a predetermined value, the remaining number of components in the stored data on the line management apparatus of the first mounting line is updated to be a tolerance in number of components initially provided with the supply reel.

4. The component mounting system of claim 1, wherein when no data associating with the reel identifier is stored on the line management apparatus of the first mounting line or line management apparatus of one of the other mounting lines, the line management apparatus of the first mounting line is configured to prompt a user to register the supply reel.

5. The component mounting system of claim 1, wherein the supply reel is configured to accommodate a plurality of components on spliced carrier tapes.

6. The component mounting system of claim 1, wherein the line management apparatuses of the plurality of mounting lines are configured to communicate directly over the central network without a centralized server.

7. The component mounting system of claim 1, wherein the component is a surface mount electronic component.

8. The component mounting system of claim 1, wherein when the stored data associating with the reel identifier on the line management apparatus of one of the other mounting lines indicates that the supply reel is presently mounted to a mounting apparatus of the one of the other mounting lines, the line management apparatus of the first mounting line or the line management apparatus of the one of the other mounting lines is configured to:
prompt a user to confirm which one of the mounting apparatuses the supply reel is mounted to, and
clear a memory of the mounting apparatus of the first mounting line and the mounting apparatus of the one of the other mounting lines.

* * * * *